United States Patent [19]

Tanida

[11] 4,253,074
[45] Feb. 24, 1981

[54] PUSH PRE-SETTING FINE TUNING DEVICE FOR TURRET TYPE TELEVISION TUNERS

[75] Inventor: Takeyoshi Tanida, Mie, Japan

[73] Assignee: New Nippon Electric Company, Ltd., Osaka, Japan

[21] Appl. No.: 14,828

[22] Filed: Feb. 26, 1979

[30] Foreign Application Priority Data

Feb. 27, 1978 [JP] Japan .................................. 53-25470

[51] Int. Cl.³ .............................. H03J 1/14; H03J 5/28
[52] U.S. Cl. ....................................... 334/49; 74/10.8; 74/384; 334/51; 334/57
[58] Field of Search ....................... 334/49, 50, 51, 52; 74/10.41, 10.45, 10.5, 10.8, 10.85

[56] References Cited
U.S. PATENT DOCUMENTS

| 3,154,742 | 10/1964 | Bell | 334/50 |
| 3,898,879 | 8/1975 | Capelle et al. | 334/51 |
| 4,041,422 | 8/1977 | Noji et al. | 334/49 |
| 4,152,682 | 5/1979 | Ito et al. | 334/51 |

Primary Examiner—Paul L. Gensler
Attorney, Agent, or Firm—W. G. Fasse; D. F. Gould

[57] ABSTRACT

The present fine tuning device comprises a fine tuning shaft mounted concentrically around a main channel selecting shaft supported in a chassis base. A plate spring member is disposed on the chassis for thrust biasing the fine tuning shaft. A gear member is arranged for transmitting the fine tuning movement from the fine tuning shaft to a fine tuning screw. The fine tuning shaft is provided with a radially extending flange and a peripheral gear, and the transmitting gear member is provided with a first gear engageable with the peripheral gear of the fine tuning shaft and a second gear engageable with the fine tuning screw. The plate spring member supports the rotating transmitting gear member whereby the axial direction of movement may be changed or shifted by deformation of the plate spring member. In this arrangement, when the fine tuning shaft is pushed to change the shape of the plate spring member, the first gear of the transmitting gear member is securely engaged with the peripheral gear of the fine tuning shaft. At the same time, the second gear of the transmitting gear member is engaged with a pinion gear of the fine tuning screw so as to permit a memory fine tuning for one of the tuning coil units selected by the main channel selecting shaft.

6 Claims, 6 Drawing Figures

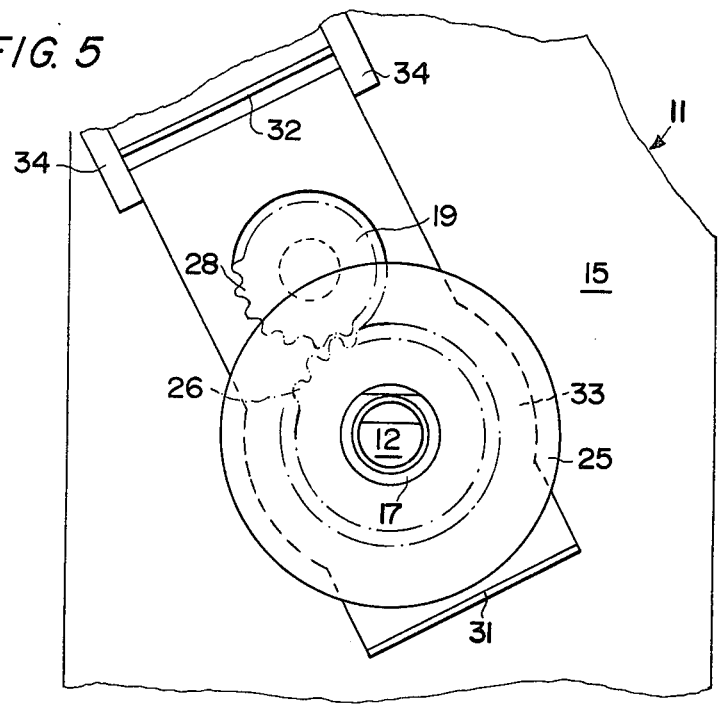
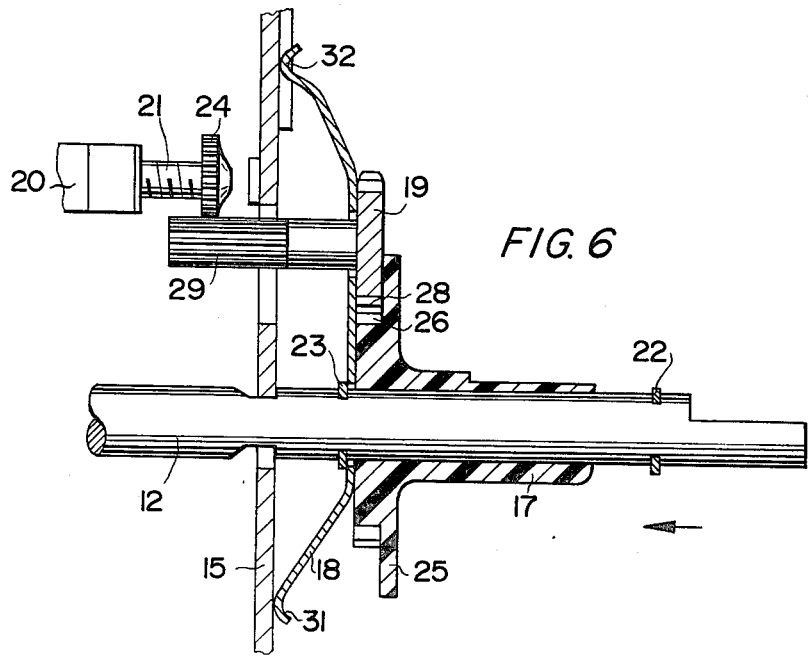

PUSH PRE-SETTING FINE TUNING DEVICE FOR TURRET TYPE TELEVISION TUNERS

BACKGROUND OF THE INVENTION

The present invention relates to a memory fine tuning arrangement used for television tuners. More particularly, the invention relates to a television tuner of the type which provides a so-called pre-setting fine tuning arrangement for an automatic fine tuning adjustment for each individual television channel. Specifically, the present invention is directed to an improved and simplified fine tuning mechanism used for push pre-setting fine tuning devices and which is manufactured economically by a minimum number of parts.

Generally, mechanical channel selecting devices for VHF television tuners are mainly classified as rotary-switching types or turret types. The turret type tuners include an incrementally rotatable channel selector shaft for selectively connecting certain ones of a plurality of tuned circuit elements for each of a plurality of channel selector positions. For a clear reception in each of the channel positions of the selector shaft, it is customary to include in the local oscillator circuit an adjustable impedance device. This impedance device is conventionally adjusted by means of a fine tuning shaft concentrically mounted with respect to the channel selector shaft. The fine tuning shaft is connectable by the viewer to adjust the tuning impedance for each predetermined position of the selector shaft. Various memory fine tuning arrangements have been proposed to maintain individual channel tuning adjustments once they have been established by the user without requiring adjustment of the fine tuning shaft of the tuner by the user each time a particular channel is selected.

One such arrangement is the push pre-setting type fine tuning device which requires the operator to push in a control knob of the fine tuning shaft while maintaining pressure on the knob to rotate the same to adjust a fine tuning element within the tuner, the other is the rotary pre-setting type fine tuning device which requires the operator to only rotate a control knob of the fine tuning shaft for the fine tuning adjustment. These devices are particularly useful on turret type television tuners having tuned coil assemblies or units for each channel. These coil units are removably mounted in the rotatable turret structure, and are provided individually with an oscillator coil, the inductance of which may be adjusted by means of an adjustable element which extends into an opening in the end of the coil units adjacent the oscillator coil.

Since television tuners are made in large volumes, in order to be commercially competitive, it is desirable to provide a low cost pre-setting fine tuning device with a minimum number of parts which may be assembled in an easy and simple manner. The fine tuning device requires a mechanical arrangement for translation of rotary motion of the fine tuning shaft into rotary motion of the adjustment element, since the fine tuning shaft is offset laterally from the axis of the adjustment element in the individual coil units. Also, engagement with the adjustment element must terminate automatically when the user releases the fine tuning shaft so that the turret is free to rotate to another channel position. For example, such fine tuning devices are disclosed in U.S. Pat. Nos. 3,316,770 and 4,128,821 for push pre-setting type memory fine tuners. U.S. Pat. No. 4,172,390; granted on Oct. 30, 1979; discloses a fine tuning device including a pivotally mounted member on the front wall of the chassis base with a coil spring between the member and the front wall to exert a bias force on the member in the predetermined direction. It has been found that the number of parts of such fine tuners may be still further reduced thereby decreasing the manufacturing costs.

OBJECTS OF THE INVENTION

In view of the above it is the aim of the invention to achieve the following objects singly or in combination:
to provide a new and improved memory fine tuning device for television tuners wherein the construction is simplified and the fine tuning of the tuner in each channel selecting position is assured;
to provide a television fine tuner using a plate spring member for mounting a gear member for transmitting the fine tuning movement, on the front wall chassis base in such a simple manner that it can be manufactured most economically by using a minimum number of parts; and
to provide a simplified push pre-setting fine tuning device for turret type television tuners.

SUMMARY OF THE INVENTION

In accordance with the present invention a memory fine tuning mechanism is provided which utilizes a leaf or plate spring member on the front wall of the chassis base. The plate spring member, which biases the fine tuning shaft in the thrust direction, supports on its inclined flat surface a gear member for transmitting the fine tuning movement of the fine tuning shaft to a fine tuning screw of the adjustable element. That is, the present fine tuning device comprises a fine tuning shaft mounted concentrically around the channel selector shaft supported in the chassis base and the plate spring member is disposed between the chassis base and fine tuning shaft, the gear member for transmitting the fine tuning movement is rotatively supported in the plate spring member, and the fine tuning adjustable screws supported movably in each end of the coil units.

The present fine tuning device utilizes the plate spring member to impart a resilient biasing force to the fine tuning shaft, and to rotatively hold the gear members for transmitting the fine tuning movement action. The plate spring member is assembled by inserting the channel selector shaft into a hole portion formed thereon, and each of its free ends is held on the surface of the chassis base to slide easily. Accordingly, by the fine tuning device of the present invention, reductions in the number of parts and in the assembling time are achieved. For example, eight parts were needed in a push type mechanism as disclosed in U.S. Pat. No. 4,128,821, but the number of parts is reduced to four parts according to the invention. In addition, the simplified assembly of the present improved structure further reduces costs.

BRIEF FIGURE DESCRIPTION

In order that the invention may be clearly understood, it will now be described, by way of example, with reference to the accompanying drawings, wherein:

FIG. 1 is a top plan view of a tuner employing a fine tuning device in accordance with this invention;
FIG. 2 is a side view of the tuner of FIG. 1;
FIG. 3 is a front view of the tuner of FIG. 1;

FIG. 5 is a partial front view of FIG. 4; and

FIG. 6 is a sectional view similar to that of FIG. 4, but showing the fine tuning state of the fine tuning device.

DETAILED DESCRIPTION OF PREFERRED EXAMPLE EMBODIMENTS AND OF THE BEST MODE OF THE INVENTION

Figure 1:
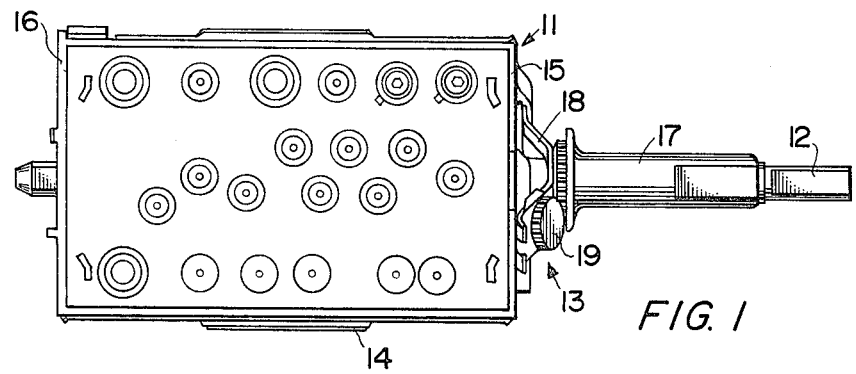
Figure 2:
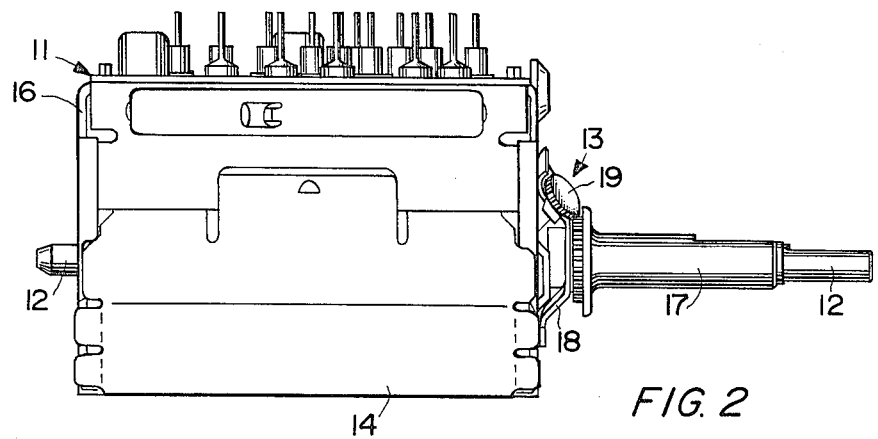
Figure 3:
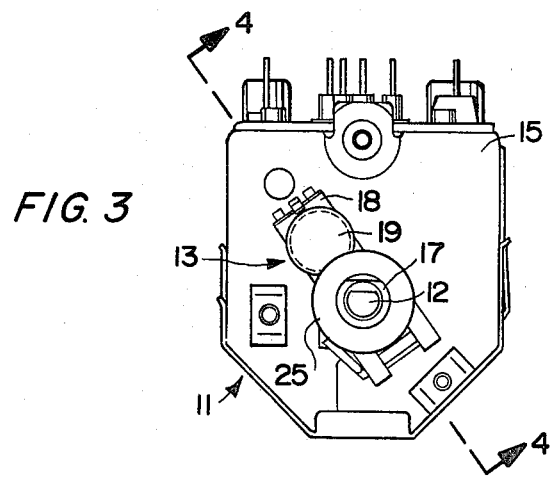

The drawings illustrate a memory fine tuning device useful for a turret type television tuner according to the present invention. In FIGS. 1 to 3 the VHF turret type tuner comprises a chassis 11, a main channel selector shaft 12, a fine tuning arrangement or device 13 and a shield cover 14. The chassis 11 has a front wall 15 and a rear wall 16, between which the channel selector 12 carries a rotatable turret (not shown). The channel selector shaft 12 is journalled in both the front and rear walls of the chassis 11 with detent means to provide for an indexing movement. In other words, a plurality of coil units are mounted within the chassis 11 at the periphery of the supporting discs fixed on the channel selector shaft 12 to form a drum shaped turret.

Figure 4:
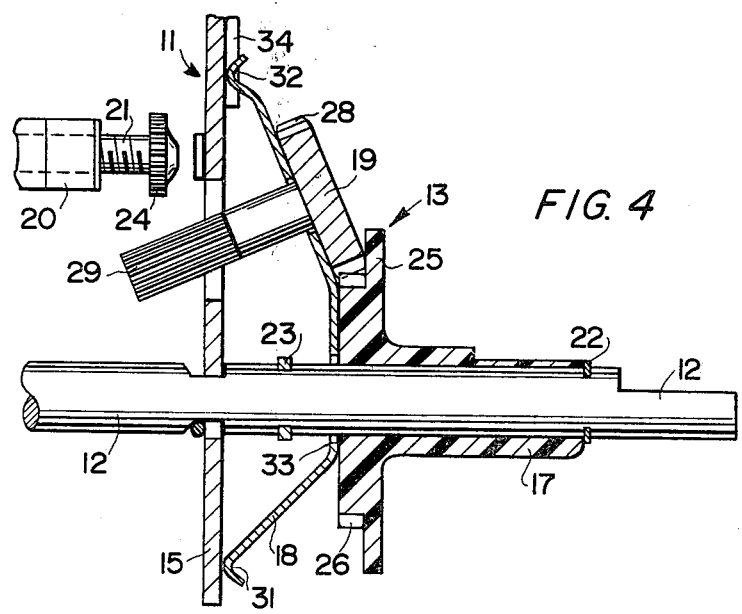
FIG. 4 is an enlarged sectional view along section line 4—4 in FIG. 3 of a partial portion of the fine tuning device of the tuner of FIG. 1.

As more clearly shown in FIGS. 4 and 5, the fine tuning arrangement or device 13 is assembled on the front wall 15 of the chassis 11. FIG. 4 illustrates the released state of the fine tuning arrangement 13. FIG. 6 illustrates the fine tuning or push pre-setting state. The fine tuning arrangement 13 comprises a fine tuning shaft 17 mounted concentrically around the selector shaft 12. A plate spring 18 is held between the front wall 15 of the chassis 11 and the rear end surface of the fine tuning shaft 17. A gear member 19 for transmitting the fine tuning movement is supported in the plate spring 18 to be rotated freely. The fine tuning operation is achieved by the engaged gears as is shown in FIG. 6 in which a fine tuning adjustable screw 21 which extends into an opening of a coil unit 20 adjacent to an oscillator coil, may be moved back and forth by rotating the fine tuning shaft 17 when the latter is in the pushed-in condition as shown in FIG. 6. Normally, that is, when no fine tuning operation is intended, the fine tuning adjustable screw 21 is disengaged from the gear member 19, as is shown in FIG. 4 whereby the channel selecting operation may be done by rotating the selector shaft 12.

The fine tuning shaft 17 is mounted to be movable in the axial direction of the selector shaft 12 within the spacing defined between the retainers 22 and 23. The plate spring 18 always biases the fine tuning shaft 17 outwardly by the resilient force of the spring. At the rear portion of the fine tuning shaft 17, a flange portion 25 extending in the radial direction and a peripheral gear 26 are provided. The gear 26 is able to engage the gear member 19 for transmitting the fine tuning movement.

The gear member 19 is provided with a first gear 28 formed at the periphery of the head portion of the gear member 19 for engagement with the peripheral gear 26, and with a second pinion gear 29 formed around the rod portion of the gear member 19 for engagement with a pinion 24 formed at the top of the fine tuning adjustable screw 21. Preferably, the fine tuning shaft 17 and the gear member 19 are made as a molded part of plastic materials such as a resin material which is light and relatively inexpensive.

Each free end 31 and 32 of the plate spring 18 which resiliently biases the fine tuning shaft 17 and holds the gear member 19, touches resiliently the front wall 15 of the chassis 11. The plate spring 18 is freely supported around the selector shaft 12 at an open hole of the plate spring 18, and the circumferential saddle portion 33 of the plate spring around the hole resiliently contacts a rear end side of the fine tuning shaft 17. Especially, on the front wall 15 of the chassis 11, a pair of projecting guide portions 34 are formed to prevent dislocation of the plate spring 18. Accordingly the plate spring 18 is able to move smoothly and to change its shape when the fine tuning shaft 17 is pushed.

In the above mentioned mechanical arrangement the fine tuning operation is accomplished by first pushing the fine tuning shaft 17 in the direction of the arrow as shown in FIG. 6, whereby the resilient biasing force of the plate spring 18 is overcome until the fine tuning shaft is stopped contacting the retainer 23. As a result, each free end of the plate spring 18 is stretched by sliding along the wall surface of the chassis 11. The gear member 19 for transmitting the fine tuning movement takes up a position almost parallel to the selector shaft 12 as opposed to the inclined position shown in FIGS. 2 and 4. Thus, the peripheral gear 26 of the fine tuning shaft 17 engages the first gear 28. The pinion gear 24 of the screw 20 simultaneously engages the second gear 29 so as to provide an operative engagement or coupling of gears in the mechanism. Therefore, when the fine tuning shaft 17 is rotated when in the pushed state, the fine tuning adjustable screw 21 is able to move back and forth within the coil unit 20 for achieving a desired fine tuning.

In the above embodiment of this invention, the retainer 23 may be replaced by an integral part of the selector shaft 12, or by using the front wall 15 of the chassis 11 as a stop if a part of the fine tuning shaft 17 is extended through the hole of the plate spring 18. Accordingly, the minimum number of necessary parts to assemble the fine tuning mechanism of this invention is four, namely, the retainer 22, the fine tuning shaft 17, the plate spring 18, and the gear member 19. The reduction of the number of the necessary parts makes the assembly easier, reduces the manufacturing costs substantially, and increases the industrial practical value of such tuners.

Although the invention has been described with reference to specific example embodiments it is to be understood, that it is intended to cover all modifications and equivalents within the scope of the appended claims.

What is claimed is:

1. In a television tuner of the turret type wherein a selector shaft carries a rotatable turret in a chassis having a front wall, and which includes a plurality of tuning coil units corresponding to different television channels each having an adjustable element (21), the improvement comprising memory fine tuning means for adjusting any one of said adjustable elements when said rotatable turret is in a predetermined position, said fine tuning means comprising a fine tuning shaft (17) comprising a radially extending flange portion (25) and a peripheral gear (26) between said flange portion and said front wall (15), said fine tuning shaft (17) being mounted concentrically around said selector shaft (12), spring means (18) comprising a resilient plate spring (18) having freely slidable end portions (31, 32) in sliding contact with said front wall of said chassis (11, 15) and a saddle portion (33) between said end portions (31, 32), said end portions extending away at an angle from said saddle portion (33), said gear (26) resting against said saddle portion in all positions of the end portions (31, 32) of the plate spring (18), for normally biasing said fine tuning shaft (17) in a direction opposite to the pushing direction of said fine tuning shaft, said resilient plate spring (18) having an opening in said saddle portion (33) through which said selector shaft (12) extends, and gear means (19) directly supported in said resilient plate spring (18) for freely rotating said gear means (19) comprising a first gear member (28) positioned between the forward facing surface of said resilient plate spring (18) and said flange portion (25), said gear means (19) being securely held between the flange portion (25) and said plate spring (18) in all positions of the plate spring for operatively engaging said peripheral gear (26) of the fine tuning shaft (17), said adjustable element (21) comprising a pinion (24), said gear means (19) comprising a second gear member (29) positioned substantially within said chassis (11) for engagement with said pinion (24) of the adjustable element (21) when said second gear member (29) is shifted for transmitting the rotary movement of said fine tuning shaft (17) to said adjustable element (21) to adjust said adjustable element for a selected one of said tuning coil units when said fine tuning shaft (17) is pushed against the force of the resilient plate spring (18), whereby the shape of said resilient plate spring (18) is changed to engage said second gear member (29) with said pinion (24) of said adjustable element (21) whereby a memory fine tuning is provided, said tuner further comprising guide means (34) for slidably guiding said resilient plate spring (18) against unintended movement, said saddle portion (33) of the plate spring (18) extending substantially in parallel to said chassis end wall in all positions of said plate spring.

2. The tuner of claim 1, wherein at least one of said freely slidable end portions (32) of said plate spring (18) forms two legs which extend into said saddle portion (33) to form between said two legs said opening through which said selector shaft (12) extends whereby the assembly of said plate spring is facilitated.

3. The tuner of claim 1, wherein said guide means (34) project from said chassis front wall, at least one end portion of said plate spring having a notch therein for slidingly engaging said guide means to permit sliding of said end portions in a given direction.

4. The tuner of claim 1, wherein said fine tuning shaft means (17) and said peripheral gear (26) are made of synthetic plastic material as a one piece component.

5. The tuner of claim 1, wherein said peripheral gear (26) of said fine tuning shaft forms an integral part of said radially extending flange portion, said plate spring means having a further opening through which said gear means (19) extend, whereby said first gear member (28) is positioned on the forward surface of said plate spring means for engagement of said peripheral gear (26) with said first gear member (28).

6. The tuner of claim 1, wherein said selector shaft comprises two spaced stop members, said fine tuning shaft being mounted between said two spaced stop members on said selector shaft with a sliding space so as to permit pushing the fine tuning shaft into a fine tuning operable position.

* * * * *